(12) United States Patent
Hakkarainen

(10) Patent No.: US 6,937,508 B1
(45) Date of Patent: Aug. 30, 2005

(54) NON-VOLATILE, HIGH-DENSITY INTEGRATED CIRCUIT MEMORY

(76) Inventor: J. Mikko Hakkarainen, 5090 Misty Morn Rd., Palm Beach Gardens, FL (US) 33418

( * ) Notice: Subject to any disclaimer, the term of this patent is extended or adjusted under 35 U.S.C. 154(b) by 0 days.

(21) Appl. No.: 10/266,541

(22) Filed: Oct. 8, 2002

(51) Int. Cl.$^7$ ............................................ G11C 11/14
(52) U.S. Cl. ........................................ 365/171; 365/96
(58) Field of Search .................... 365/96, 171, 173, 365/158

(56) References Cited

U.S. PATENT DOCUMENTS

| | | | |
|---|---|---|---|
| 6,525,953 B1 * | 2/2003 | Johnson ........................ | 365/63 |
| 6,646,910 B2 * | 11/2003 | Bloomquist et al. ......... | 365/158 |
| 2003/0207486 A1 * | 11/2003 | Deak ............................. | 438/33 |

* cited by examiner

Primary Examiner—Anh Phung
(74) Attorney, Agent, or Firm—Henry S. Kaplan

(57) ABSTRACT

A high density memory for use with integrated circuit technology is disclosed. The memory comprises one or more memory cells including a word line conductor, a via having a first resistive state and a second resistive state, and a bit line conductor. The bit line conductor has high conductance in a first state and low conductance in a second state. The via has high resistance in a first state and low resistance in a second state. The state of the via may be user-programmable. There maybe a plurality of word lines and bit lines arranged in overlying relationship with a plurality of vias disposed at the intersections of the word and bit lines. Because the memory cells do not rely on transistors formed in the substrate of the integrated circuit, multiple layers of word lines, vias, bit lines may be arranged to increase density.

20 Claims, 11 Drawing Sheets

NON-VOLATILE, HIGH-DENSITY INTEGRATED CIRCUIT MEMORY

FIELD OF INVENTION

The present invention relates generally to the field of semiconductor integrated circuit ("IC") fabrication processes, and particularly, to a non-volatile high-density memory array using inter-connect layers in an IC fabrication process.

BACKGROUND

In the field integrated circuit (IC) memory, improving the bit-density of a memory has been a goal for numerous reasons, including reduction of cost and size, and improvement in productivity. One tactic is to decrease the size of an individual memory cell. A second is to add a third dimension (multiple layers) to conventional two-dimensional (planar) structures. However, cells are approaching geometric limits, and further dramatic reductions of memory cell size are unlikely with conventional memory cell design style as evidenced by its long history of multiple small, incremental improvements over the past three decades.

Conventional memory cells contain at least one transistor, two access ports, and one or more control ports. The need for a transistor (or transistors) with their accompanying control port(s) places severe restrictions on future improvements in memory density. First, the ability to reduce cell size further through design innovation is limited because cell size has become largely dependent on improvements in lithographic and fabrication techniques. Second, the option to add multiple cell layers is forfeited because modern IC technologies can currently only place good quality transistors (required in transistor based memory cells) in a single layer, the substrate.

Another approach taken by the prior art in U.S. Pat. No. 6,185,122 has been to use a memory cell comprising a current steering element in series with a state change element, eliminating the need for one or more transistors within the memory cell. This arrangement allows placement of memory cells in multiple layers above the substrate as long as a suitable current steering element (such as a diode) is available for the memory cell. Essentially, conductors are arranged in a grid of multiple layers with memory cells placed at the intersections of orthogonal conductors in adjacent layers. While this offers a substantial improvement by the addition of memory cells in multiple vertical layers, restrictions are placed either on the type of conductor material or the current steering element in the memory cell or both to achieve the most easily manufactured solution.

This invention describes a different approach to overcome past limitations by employing memory cells that do not require any transistors or current steering mechanism but are simple, extremely small interconnect—only two-terminal cells. The memory cell state, bit state 0 or bit state 1, is denoted by the resistance level of the cell either high or low, and is accessed by a conductor with controllable conductance states. This structure can be formed as a multiple layer array above the substrate with extremely high bit densities yet its bit states are accessible with small and efficient circuitry outside the array.

SUMMARY

A high density memory for use with integrated circuit technology is disclosed. The memory comprises one or more memory cells including a word line conductor, a via having a first resistive state and a second resistive state, and a bit line conductor. The bit line conductor has high conductance in a first state and low conductance in a second state. The via has high resistance in a first state and low resistance in a second state. The state of the via may be user-programmable. There may be a plurality of word lines and bit lines arranged in overlying relationship with a plurality of vias disposed at the intersections of the word and bit lines. Because the memory cells do not rely on transistors formed in the substrate of the integrated circuit, multiple layers of word lines, vias, bit lines may be arranged to increase density.

BRIEF DESCRIPTION OF THE DRAWINGS

The present invention will be best understood by reference to the following detailed description, with reference to the accompanying schematic drawings.

DETAILED DESCRIPTION

Figure 1:
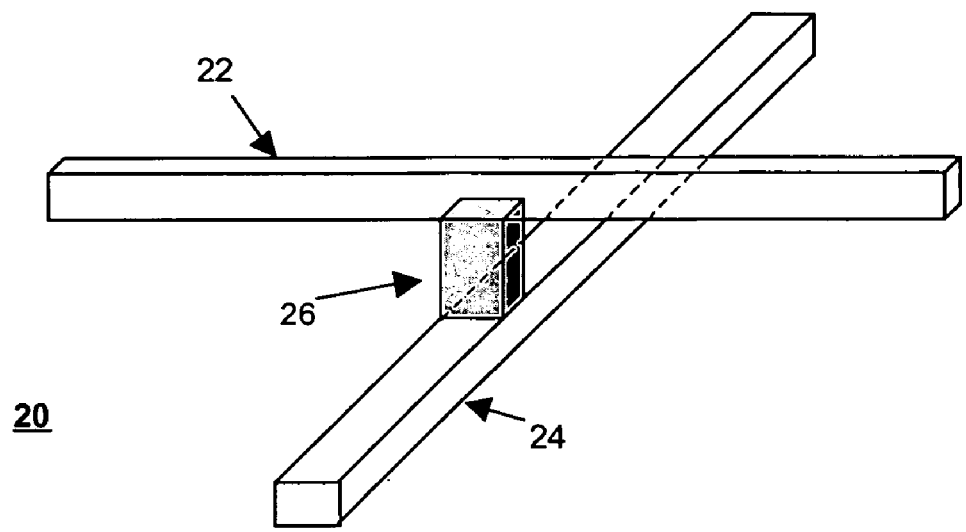
FIG. 1 is a drawing of one embodiment of a ROM cell according to the present invention.

In generally, a memory cell comprising a resistive connection between two conductors is disclosed herein. The memory cell can assume two different resistive states, i.e., two different resistances R0 and R1. As explained below, the greater the difference between R0 and R1, the easier bit sensing, that is a readout becomes. The extreme, and often desirable values for R0 and R1 are the minimum and maximum achievable resistances in any particular manufacturing process, the minimum approaching a perfect "short" circuit, that is zero resistance, and the maximum approximating an "open" circuit, that is infinite resistance. While use of these extreme values is not necessary to the operation of this invention, to purposes of explanation only, one resistance state is referred to herein as "short" and the other as "open." One example of the "short" state would be the presence of a conductor, with the "open" formed by the absence of a conductor or presence of an insulating layer. It should be understood that a short state is not required to have an unusually low resistance, and an open state is not required to have an unusually high resistance; it is only desired that there be a detectable difference between the two resistive states so that the memory array of the present invention is operable. The discussion below refers to the two distinct resistive states as "short" or "open" to achieve better clarity of explanation and afford the reader a more intuitive understanding of this invention.

The presence or absence of a conductor, a short or an open at any particular memory cell location can be determined prior to the manufacture of the memory array, and the array is then made with such a predetermined map of shorts and opens. The memory is permanent and unchangeable, and is thus a Read-Only-Memory (ROM). This memory cell has only two terminals, which are the minimum required for electrical readout of any cell state.

If a user-programmable memory is desired, such that the determination of a short or open state is programmable after manufacture, the state memory of the cell must be alterable by the user. If the memory cell construction is such that this state change can be done just once due to the destructive nature of the state change process, the overall memory is a One-Time Programmable Read-Only-Memory (OTPROM, sometimes also referred to in the industry as an OPROM). It should be underrstood that whether the state change operation turns an "open" into a "short" or vice versa is not important, only the fact that a consistent alteration method is in place is important. For example, one such destructive user programming method can be achieved by making every memory cell during manufacture from the "series" placement of a conductor and a thin insulator. After manufacture all memory cells are in an open state because of the presence of the insulating layer. This layer can be electrically destroyed, that is turned into a short by several possible well-known methods. For example, applying a programming voltage in excess of normal operating voltage can break down the thin insulator, and create a short. This process is generally not reversible. It is thus understood that this structure can form a one-time programmable memory cell. This feature makes the memory more general purpose than the ROM cell described above by adding thin layers of insulation in the processing of the memory IC. While the above example has an anti-fuse element that can be transferred from an open to a short, it is clear that a fuse element can also be used to transfer from a short to an open. Such a fuse can be formed, for example, with a thin conductive filament that can be "burned" open with electrical power (current and voltage).

Because of its structural simplicity, the memory cell of the present invention can be easily located, for example, at the intersection of two conductors that normally have an insulating material separating them. Therefore, typical interconnect material of an IC process such as metal, metal alloy, or polycrystalline silicon can be used for the conductors.

The memory cell may be made of virtually any resistive material available to the manufacturing process in question, although it is understood that some choices are more convenient, more economical, easier to fabricate, or afford better overall performance than others. The choice of memory cell material is often (although not necessarily) most advantageous when based on the choice of material for the conductors that access the memory element. For example, if the conductors are made from some metal or metal alloy, the memory element is preferably made from the same metal or alloy.

When the conductors are metal interconnect layers available in typical IC processes, an example of a ROM cell is the presence or absence of a single "via" (connection or jumper between two metals) or several "vias" in series. It is clear however that the conductors need not be metal but could for example be polysilicon, in which case polysilicon plugs with contacts may serve as memory elements between layers.

Similarly, an example of a one time programmable read only memory cell (PROM) is a "via" (or several series "vias") with an insulating layer such as silicon dioxide or nitride at one end of the via or vias ("above" or "below"). This places the initial cell state into "open": the insulating layer can later be destroyed electrically to create a "short" in a one time programming event.

With respect to a fabrication process, while modern IC fabrication processes have transistors in only one plane (the substrate), interconnect is routinely done in multiple levels. For example, 2-poly, 5-metal processes are commonplace. More advanced processes routinely employ up-to 4 polysilicon and 8 metal interconnect levels. The multiple levels are primarily intended to facilitate more compact connectivity between multiple transistors in the substrate. This invention makes alternate use of these interconnect layers by arranging them to a multi-layer grid of interconnect with the simple memory cell described previously inserted at intersections. In the case of the ROM cell, when compared to a standard process, more than one additional mask may be used for each memory cell layer. Both n- and p-type polysilicon doping is necessary, with one type (n or p) requiring two different doping levels (light and heavy). Additionally for the PROM cell, a thin layer of insulation (e.g. silicon dioxide) needs to be grown or deposited at one end of the conductive memory cell block.

FIG. 1 is a drawing of one embodiment of a ROM cell according to the present invention. ROM cell 20 includes a word line 22, a bit line 24 and a cell via 26. Whether the cell via 26 conducts current, that is whether cell via 26 is short or open at any particular memory cell location is determined prior to the manufacture of the memory array when preparing maskworks. The maskworks may be considered a predetermined map of shorts and opens. This example of a ROM cell 20 is not user programmable.

Figure 2:
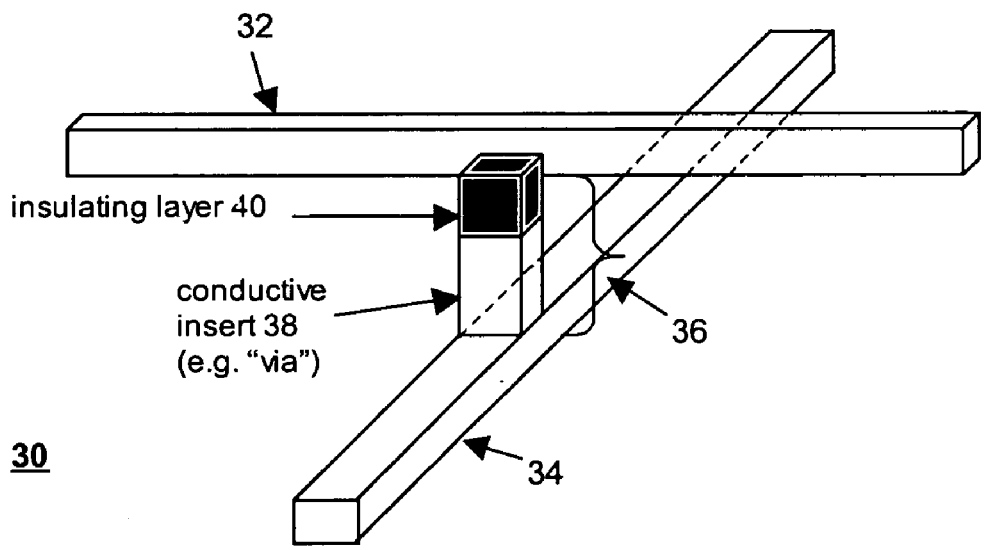
FIG. 2 is a drawing of an embodiment of an OTPROM cell according to the present invention.

FIG. 2 is a drawing of an embodiment of an OTPROM cell according to the present invention. The OTPROM memory cell 30 includes a word line 32, a bit line 34 and a programmable via 36. The cell via 36 includes a "series" placement of a conductor 38 and a thin insulator 40 connecting word line 32 and bit line 34. At the time of manufacture and prior to programming, all memory cells are in an "open" state because of the presence of the thin insulator 40. The user may program the OTPROM memory cell 30 by applying a voltage sufficient to break down the thin insulator 40. This is an example of an "anti-fuse" via to selectively program a short. In the alternative, the thin insulator 40 may be replaced with a fusible element to selectively program an "open." Although the cells in the drawings are drawn as vertical structures a horizontal orientation is equally functional.

The terms "word line" and "bit line" are used in connection with the single memory cell of FIG. 2 for purposes of explanation so that there is no confusion when, in accordance with another aspect of this invention, an array of such memory cells is described. In such an array, bit lines read each "bit" of a "word" of bits selected by a given word line.

Figure 3:
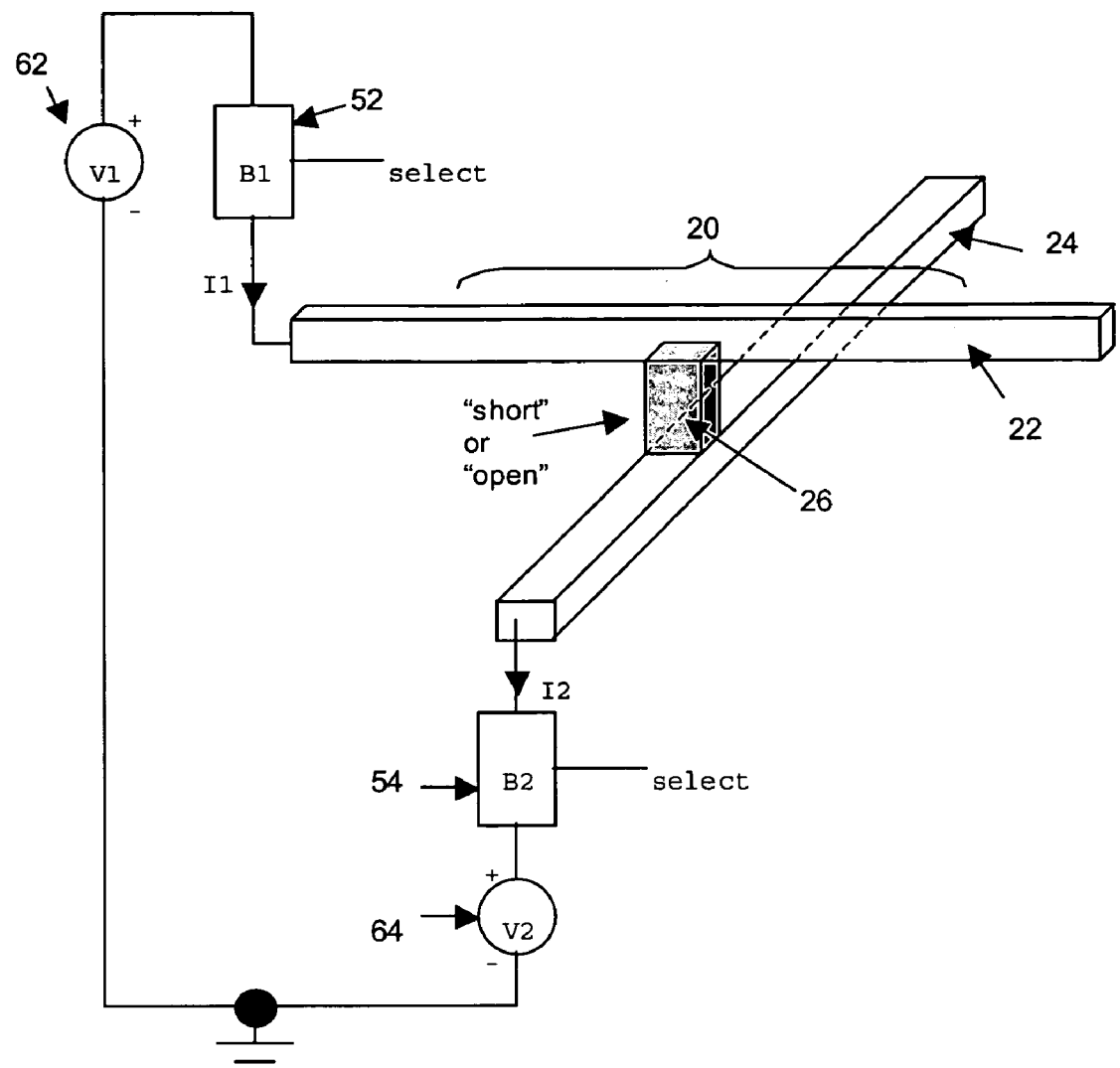
FIG. 3 is a drawing of one embodiment of a bit-sensing circuit according to the present invention.

FIG. 3 is a drawing of one an embodiment of a bit-sensing circuit shown in combination with ROM cell 20 according to the present invention. "Bit sensing" is the term given to the reading of data from one or more memory cells. The bit detection scheme mechanism includes word sense circuit 52 and bit sense circuit 54. Word sense circuit 52 is coupled to word line 22 and bit sense circuit 54 is coupled to bit line 24. Additionally, word sense circuit 52 is tied to one voltage source V1 at 62 and bit sense circuit 54 to a different voltage source V2 at 64. Typically, one voltage source would be power and the other ground. For example, known integrated circuits operate at voltages of +5 VDC and ground, ground and −5 VDC, and other voltages. Circuits may also be operated between two voltages, neither of which is ground. Each sense circuit has a control terminal to "select" it for the purpose of bit sensing: when selected, the sense circuit is "ON" (able to conduct or provide sensing current) and when not selected, the sense circuit is "OFF" (not able to provide sensing current).

In one example, in operation, assume V1 at 62 is greater than V2 at 64. When word sense circuit 52 is selected, a current I1 is forced (current is sourced) from V1 to word line 22 and when bit sense circuit 54 is selected, a current I2 is pulled (current is sunk) from bit line 24 to V2. If the memory cell via 26 is open, word line 22 is forced towards V1 and bit line 24 is pulled towards V2. If the memory cell 26 is short, the voltage drop across memory cell via 26 is relatively low and word line 22 and bit line 24 are essentially at the same voltage. This voltage is closer towards V1 if I1 is greater than I2, but closer towards V2 if I1 is less than I2.

One example of bit sensing compares the voltages at word line 22 and bit line 24. If the voltage at word line 22 exceeds the voltage at bit line 24, the bit is assigned one binary value, while if the two voltages are approximately equal the bit is assigned the opposite binary value. Another method for bit determination looks at only one of the voltages of word line 22 or bit line 24. The choice of which voltage determines the bit value depends on the relative values of the currents I1 and I2. If I1 is larger than I2, voltage at word line 22 is close to V1 at 62 for both "open" and "short" values of the cell, thus the voltage at bit line 24 determines the bit. The opposite is true if I1 is less than I2, then voltage at word line 22 determines the bit value.

Note that while word sense current I1 at 52 and bit sense circuit 54 are explained in terms of current sources, the word sense circuit 52 and bit sense circuit 54 do not need to be "current sources" in the strict sense of the term that is delivering a constant current regardless of voltage across the element. As will be clear to those skilled in electrical circuits, the only requirement on word sense circuit 52 and bit sense circuit 54 is that they be able to source (sink) currents that are sufficiently different from each other such that the voltage of either word line 22 or bit line 24 changes reliably and sufficiently to allow distinction between an "open" and a "short" circuit cell via.

Similarly, as heretofore explained the cell via, while referred to as an open or short circuit does not need to be substantially close to these ideals, that is only a reasonable difference in resistance between the two states is required in order for this sensing mechanism to work for some values of the currents I1 and I2. Nevertheless, for practical reasons it is generally preferred to use extreme values of resistance, as this affords easier and more reliable sensing.

Another example of bit sensing is as follows. The arrangement discussed above has the characteristic that when the memory cell is configured as an open, word sense circuit 52 and bit sense circuit 54 can only conduct current transiently during the sense operation, but if the cell is a short, some current is conducted continuously during bit sense (read), making it wasteful of power. It is possible to avoid continuous conduction of current during read if word sense circuit 52 and bit sense circuit 54 are selected to be ON at different times instead of simultaneously. In this case, bit sensing is done at word line 22 if word sense circuit 52 is ON first in the read sequence (bit sense circuit 54 OFF), and bit sensing is done at bit line 24 if bit sense circuit 54 is ON first (with word sense circuit 52 OFF). For example, let word sense circuit 52 be ON first: this action pulls word line 22 high towards V1 (bit line 24 will follow if cell is short and not follow if cell is open, ignoring any unintentional parasitic impedance). When bit sense circuit 54 comes ON, word line 22 stays high near V1 if the memory cell is an open, and is pulled low near V2 if the cell is a short.

It is also understood that in the second sequential method of sensing, the currents I1 and I2 do not need to have any particular magnitude relationship: I1>I2; I1<I2 and I1=I2 all are acceptable.

Figure 4:
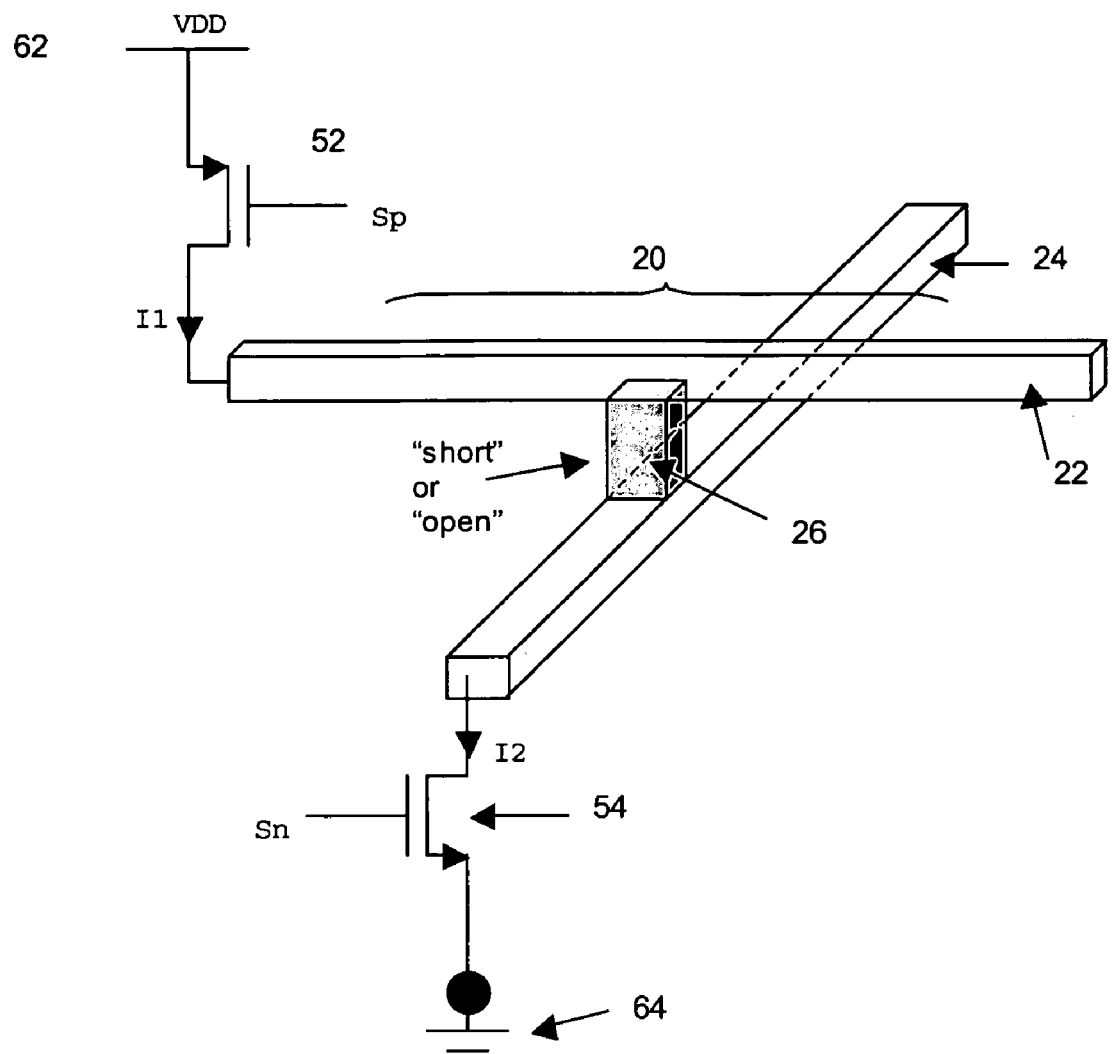
FIG. 4 is a drawing of another embodiment of a bit-sensing circuit according to the present invention.

FIG. 4 is a drawing of another embodiment of a bit-sensing circuit according to the present invention. In this example word sense circuit 52 and bit sense circuit 54 are implemented as transistors. The gates of the transistors are used for the select terminals. In this way, the word sense circuit 52 and bit sense 54 may be implemented as switches. Switches come in many varieties, depending on the IC process used, being either single transistors such as, but not limited to, MOS, FET or bipolar, or more complex two—or more multi-transistor circuits. Because of these multiple implementation possibilities, it is emphasized that the bit sensing is not dependent on any particular circuit realization of word sense circuit 52 and bit sense circuit 54, and the sense circuits are not necessarily limited to switches. In FIG. 4, word sense circuit 52 is a PMOS transistor and bit sense circuit 54 is an NMOS transistor with their gates acting as select terminals: When bit sense circuit 54 select (Sn) is "high" the NMOS transistor is ON and when word sense circuit 52 select (Sp) is low the PMOS transistor is ON. Furthermore, as shown in FIG. 3 in conjunction with FIG. 4, $V_1$=power=VDD at 62, and V2=ground=0V at 64.

Figure 5:
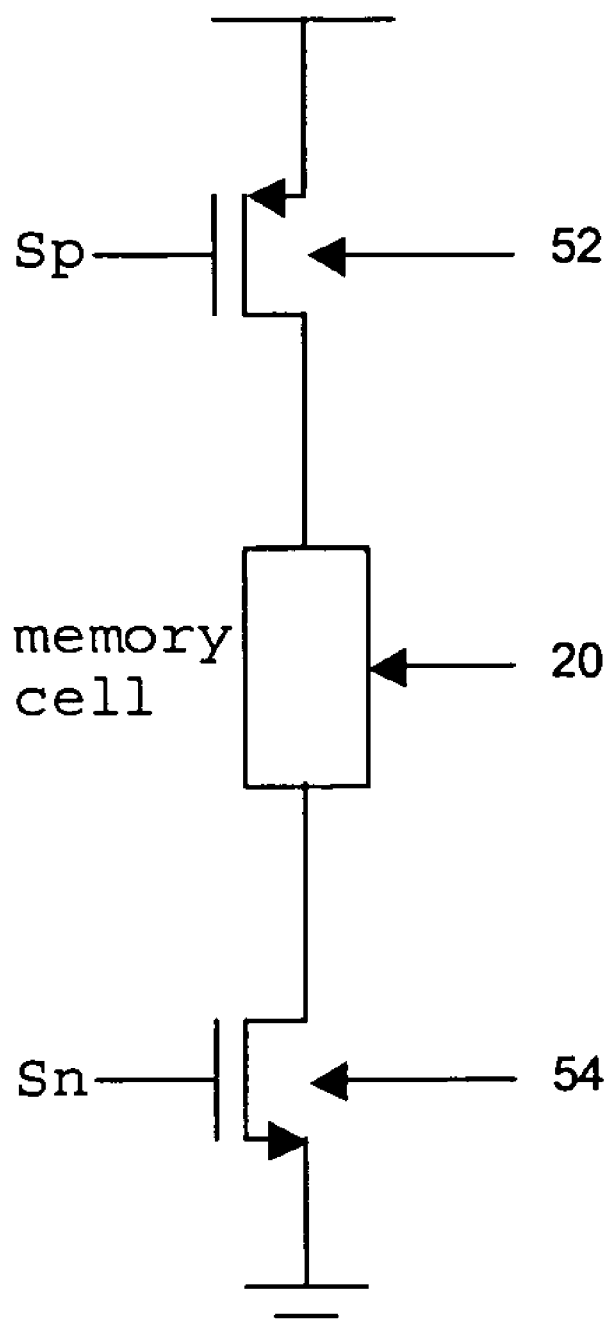
FIG. 5 is a drawing of another embodiment of a bit-sensing circuit according to the present invention.

FIG. 5 is a drawing of another embodiment of a bit-sensing circuit according to the present invention. This equivalent circuit of the cell and sense circuit applies to either the ROM cell of FIG. 1 or the PROM cell of FIG. 2 and shows an equivalent circuit of the readout technique described with respect to FIG. 4.

Figure 6:
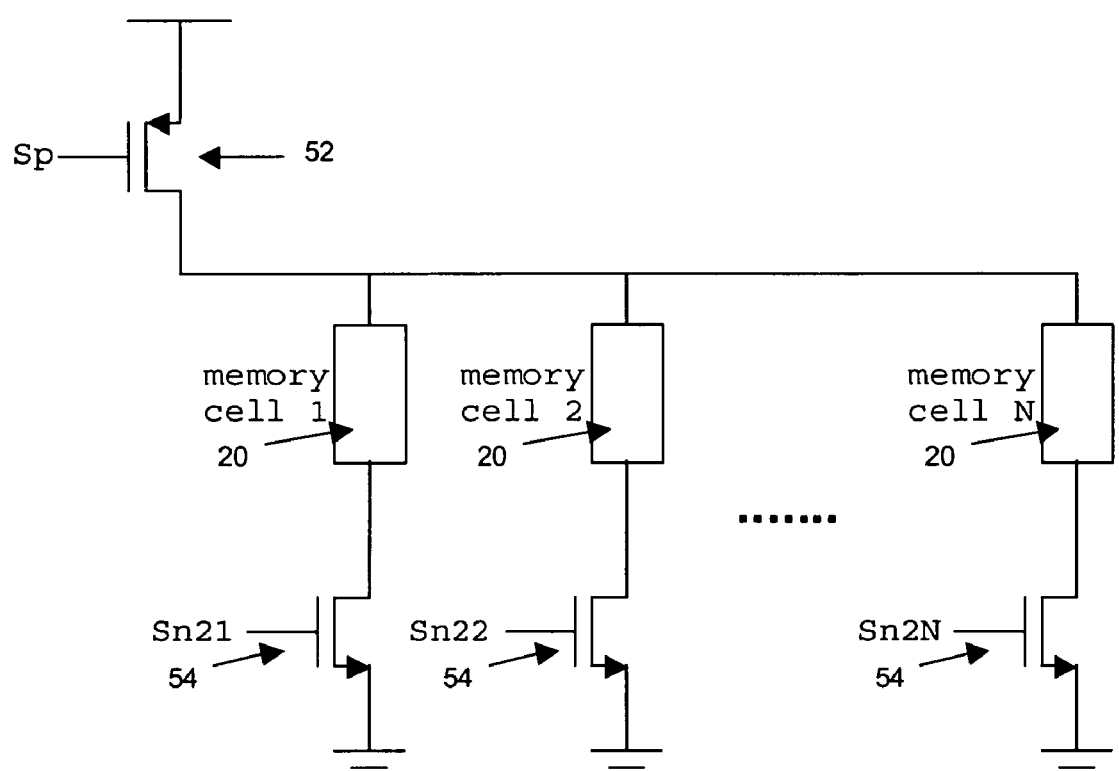
FIG. 6 is a drawing of an embodiment of a bit sensing circuit according to FIG. 4 for multiple bit lines and a single word line according to the present invention.

FIG. 6 is a drawing of an embodiment of a bit sensing circuit according to FIG. 4 for multiple bit lines and a single word line according to the present invention. When forming a multi-layer array, with a single word line but multiple parallel bit lines, there are multiple intersections and memory cells. The sense circuitry requires a single word sense circuit 52, but multiple bit sense circuits 54. For this case, an equivalent circuit may use PMOS and NMOS as transistors. This "one-dimensional" array does not impose special requirements on either the word line or the bit lines of the memory cells.

Figure 7:
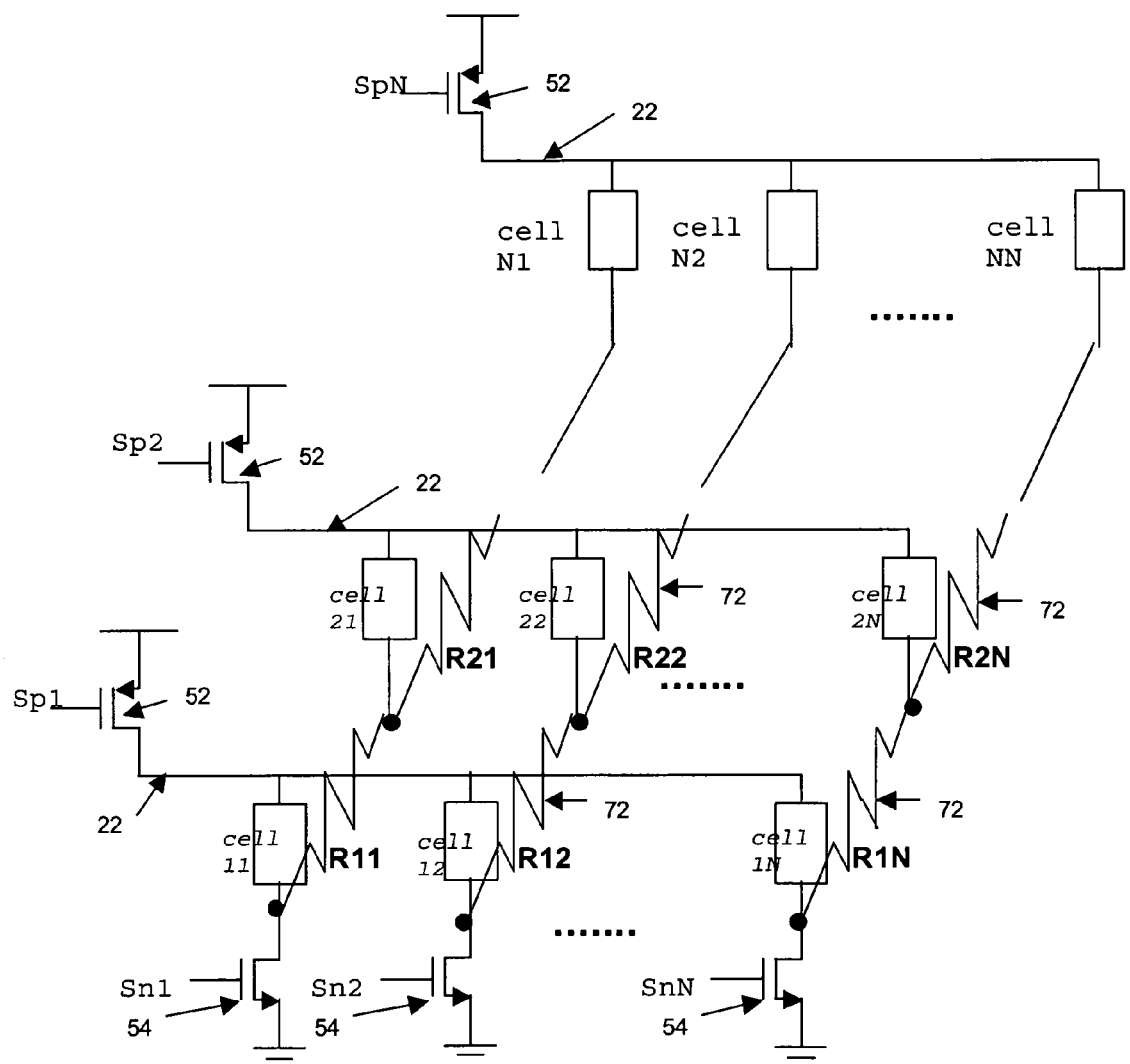
FIG. 7 is a drawing of an embodiment of the present invention having multiple bit-lines and multiple word lines according to the present invention.

FIG. 7 is a drawing of an embodiment of the present invention having multiple bit-lines and multiple word lines. This example uses controllable conductance (resistance) of one of the two conductor layers. For example in FIG. 7, each of the bit lines has a controllable resistance 72. Each bit line 24 is controllable independently of the other bit lines 24. In general the controllable resistance 72 is intentionally turned "on" when the corresponding bit sense circuit 54 is "on." In particular, all controllable resistances 72 along a given bit line 24 are turned "on" when the corresponding bit sense circuit 54 is "on". The figure omits the control terminals of controllable resistors 72 for clarity.

The two-dimensional array is sensed using techniques similar to those described above with reference to a single memory cell structure, with the following addition. In the implementation of FIG. 7, all of the memory cells at the intersections of one bit line 24 and multiple word lines 22 are sensed at a time. This means that only one of the bit sense circuits 54 is on while the others are off. Simultaneously, the conductance of a particular bit line 24 connected to the selected bit sense circuit 54 is increased by the control voltage not shown in FIG. 7, while the conductance of the other bit lines 24 is lowered, ideally causing them to become open circuits. By this control mechanism the two-dimensional structure may be temporarily reduced to the one-dimensional example discussed above. Therefore the two-dimensional array of any arbitrary number of memory cells at the intersections of N word lines and N bit lines only requires 2N control circuits (N each for word and bit lines).

As a further explanation of the operation of the two-dimensional array, consider why all bit lines 24 cannot have the same (high) conductance during sense mode even if only one of the bit sense circuits 54 is on (selected) with the others off. This requirement exists because the presence of additional conductive paths through adjacent memory cells and word lines provides "collateral flow" or parallel circuits to bypass the selected memory cells in question, making it practically impossible to determine memory cell status in the full array. This requirement can also be stated as follows: for each memory cell 20, an isolation method from other memory cells is required. This design exploits non-linear, controllable resistance 72 in the bit-line interconnection between for example memory cells 20 to afford such isolation. Obviously, this isolation method could instead be included in the word line (with the bit line conductive); this reversal should be obvious to those in the art in the sense that in both cases one line (word or bit) is conductive and the other conductance controlled. In addition, and as should be clear from this specification, both the word and bit lines could be conductance controlled, although in practice this redundant control would degrade the array's electrical performance.

Put another way bit lines have a controllable resistance Rij that is turned "on" when bit line select Snj is "on" (control terminal of Rij is omitted from drawing for clarity of presentation). For example R12, R22, R32, . . . etc. are turned "on" when Sn2 is "on".

Figure 8:
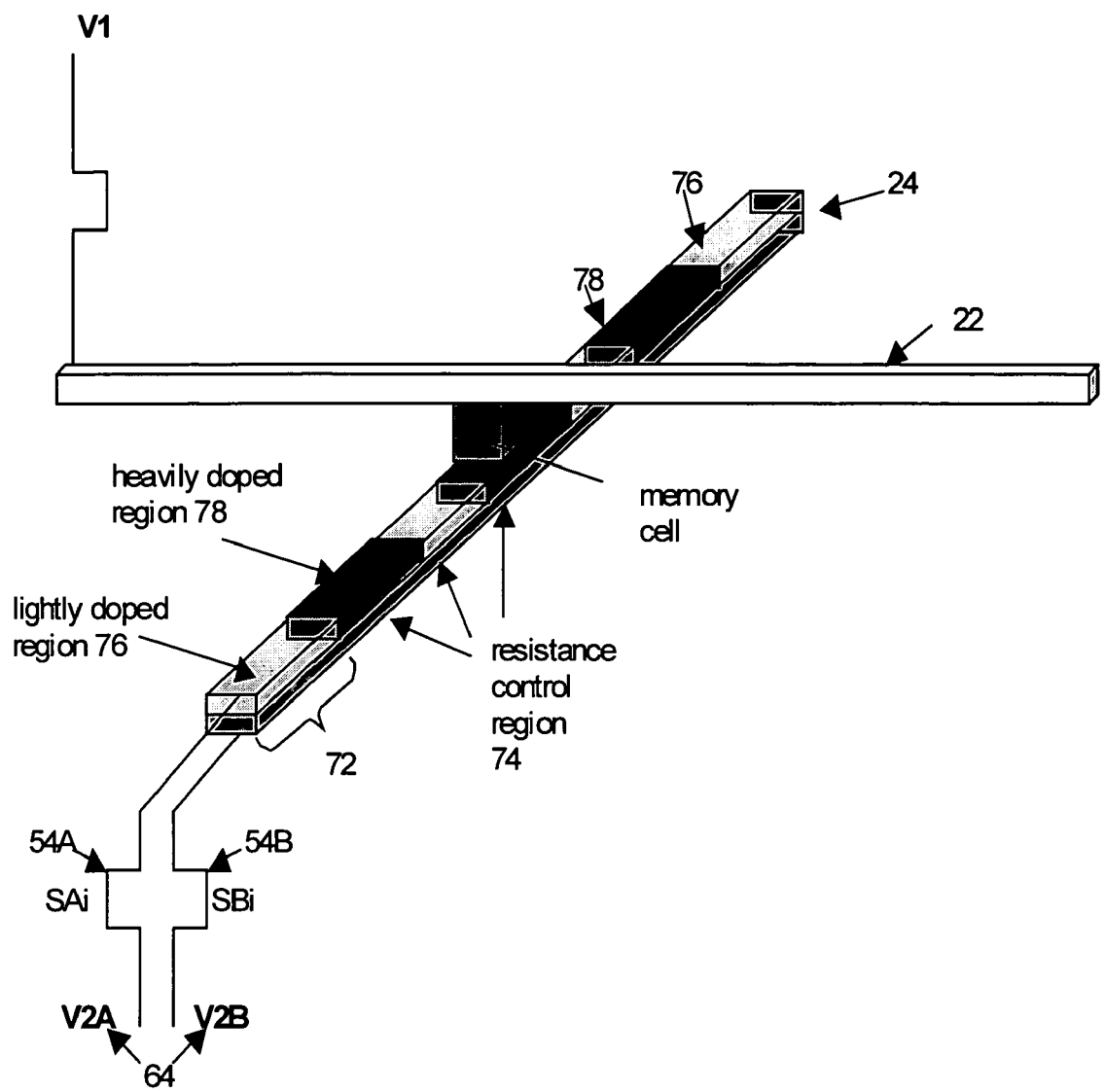
FIG. 8 is a drawing of another embodiment of a word line—memory cell—bit line combination according to the present invention.

FIG. 8 is a drawing of another embodiment of a word line—memory cell—bit line combination according to the present invention showing impementation of controlled resistance. In this example, bit line 24 comprises a first layer comprising control region 74 and a second layer comprising lightly-doped regions 76 alternating with heavily-doped regions 78 disposed on top of the control region 74. The heavily-doped regions 78 are disposed under the cell vias 26 of the memory cell 20. The lightly-doped regions 76 separate the heavily-doped regions 78 and, therefore, the memory cells 20. Also shown in FIG. 8 is word line 22, which may be a simple conductor, such as metal. In FIG. 8 the memory cell of FIG. 1 is used for purposes of explanation only and other memory cell configurations are possible including, but not limited to the memory cell configuration of FIG. 2.

The control region 74 of the bit line 24 controls the resistance of the top regions, lightly-doped regions 76 and heavily-doped regions 78, much in the same way as a JFET transistor structure. The heavily-doped regions 78 are generally conductive. With an appropriate control voltage V2B applied through bit sense circuit 54B to the control region 74, the resistance of the lightly-doped region 76 can be either "low" or "high". Lightly-doped region 76 and heavily-doped region 78 thus form a controlled resistance region of the bit line 24. For example, assume that the control region 74 is heavily doped n-type polysilicon, the lightly-doped region 76 is lightly doped p-type polysilicon, and the heavily doped region 78 is heavily doped p-type polysilicon. If a low level voltage V2B (e.g. ground) is applied to the n-type control region 74, the resulting resistance of the p-type lightly-doped region 76 is low (highly conductive). On the other hand, a high level voltage V2B (e.g. supply voltage) will pinch-off the lightly-doped p-type region 76, resulting in high resistance (non-conductive). The majority carriers of the lightly doped region 76 (in this case holes) drift away and are collected for example by suitably biased voltage V2A at the end(s) of the controlled resistance region of bit line 24. Of course, the doping polarities of the n-type 74 and p-type 76/78 regions could be reversed (region 74 p-type and regions 76/78 n-type).

The heavily doped regions 78 of FIG. 8 in the upper level of bit line 24 are included to facilitate establishing a contact with the memory cells 20. They have the added benefit of helping reduce the total bit line 24 line resistance, improving performance speed.

Furthermore, the control region 74 could be made from a variety of conductive materials. The bit line 24 utilizes field-effect operation and it is well known that field-effect devices can be made from a variety of materials for control region 74 ("gate"), which is coupled to semiconductive material for controlled region 76 ("channel"). Thus the arrangement discussed above is one example of many possible embodiments as should be understood as merely illustrative of the invention and is not meant as limiting as will be understood by those skilled in the art.

As a further example, yet another resistance control structure is achieved if the control region 74 is made of a two layer region comprising an insulating layer and a conductive layer with the insulating layer facing the controlled resistance region 76/78. In contrast to the JFET-like example above, this structure resembles a MOS device.

Figure 9:
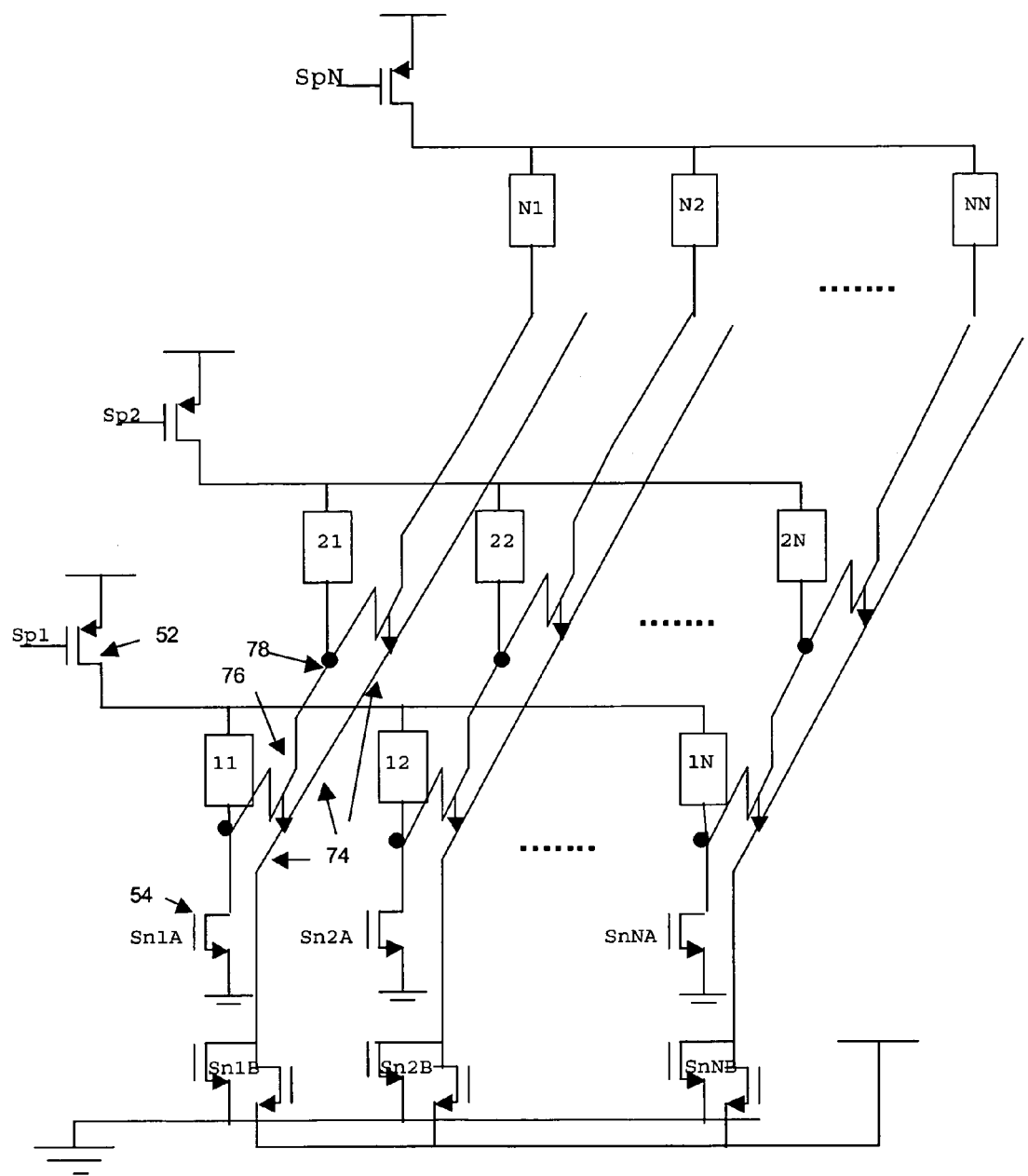
FIG. 9 is a drawing of another embodiment of the invention having multiple parallel word lines and multiple bit lines.

FIG. 9 is a drawing of another embodiment of the invention having multiple parallel word lines and multiple bit lines. FIG. 9 is illustrative of readout techniques of the types exemplified in FIG. 7 and FIG. 8 for bit sensing for multiple parallel word lines 22 and multiple bit lines 24 (two dimensional grid), where the resistance of bit lines 24 is controlled by voltage applied to the resistance control region 74 of bit line 24. In this circuit, the individual lightly-doped regions 76 are indicated as "channel" regions of individual "JFET" transistors.

With this in mind, the circuit of FIG. 9 allows sensing bit levels as follows. When a low voltage is applied to region 74 of a selected bit line, a conductive path is created for the memory cells connected to this bit line. The individual bit states can then be inferred from measurements of word line voltages. Each word line in question is pulled low if the memory cell is a short but remains high if the cell is an open. The unselected bit lines have a high control voltage and do not affect this read out result.

An alternative bit sensing process combines the functions of the controlled resistance regions 76/78 with the control region 74 in the case of the JFET-like structure. For example, an n-type control region 74 causes pinch-off of p-type controlled region 76/78 when its voltage is high but accepts current when low and provides an additional current flow path for the bit line when it is selected for read out. Note however that this mechanism of action is not available for the MOS-like resistance control region 74. It is therefore not an essential feature of this overall invention but may afford a convenience in operation.

Typically available polysilicon doping levels and conductor thickness are often acceptable to achieve the pinch-off effect. In other words, the doping levels do not have to be outside ordinary levels and neither does the conductor thickness need to be restricted to be unusually thin. For example, applying a 5V control voltage to control region 74 relative to controlled regions 76 and 78, coupled with an average doping level of $10^{15}$ cm$^{-3}$ for the lightly doped polysilicon region 76, would allow the polysilicon thickness to be up to about 2.5 µm. Smaller polysilicon thickness allows smaller control voltages which may sometimes be desirable. However, this example serves to illustrate that this invention allows entirely practical manufacturing solutions and is able to operate under common voltage levels. It should also be noted that while most IC processes tend to use high doping level for polysilicon to reduce its overall resistance, lower doping levels are also available and are not an unusual fabrication request. This structure is thus compatible with fabrication in a modern IC process.

In the preceding discussion the controlled resistance 76/78 is placed only on the bit line conductor. Naturally, as mentioned earlier, the word line conductor could instead be configured as the controlled resistance region with the bit line a simple conductor. Additionally, both conductors could be made as controlled resistances although this adds complexity and may reduce performance. Nevertheless, all three such structures (bit line alone, word line alone, or both as controlled resistance regions) should be considered equivalent.

The preceding discussion has focused on memory structure and bit sensing (readout) techniques. For the case of OTPROM cells in two-dimensional array, a brief explanation of array programming follows. Assuming anti-fuse type OTPROM cells, sufficiently high voltage needs to be applied across those cells that need to be changed from an "open" to a "short". This can be done by techniques similar to readout. For example, if a word line is biased to a high voltage, those bit lines that need a "short" for the memory cell at the word line/bit line intersection should be biased to a low voltage. Those cells that need to remain "open" should have the corresponding bit lines biased to another suitable high voltage. The precise voltage levels are design details that depend for example on insulator breakdown, polysilicon pinchoff, and polysilicon junction reverse breakdown characteristics of the process.

Figure 10:
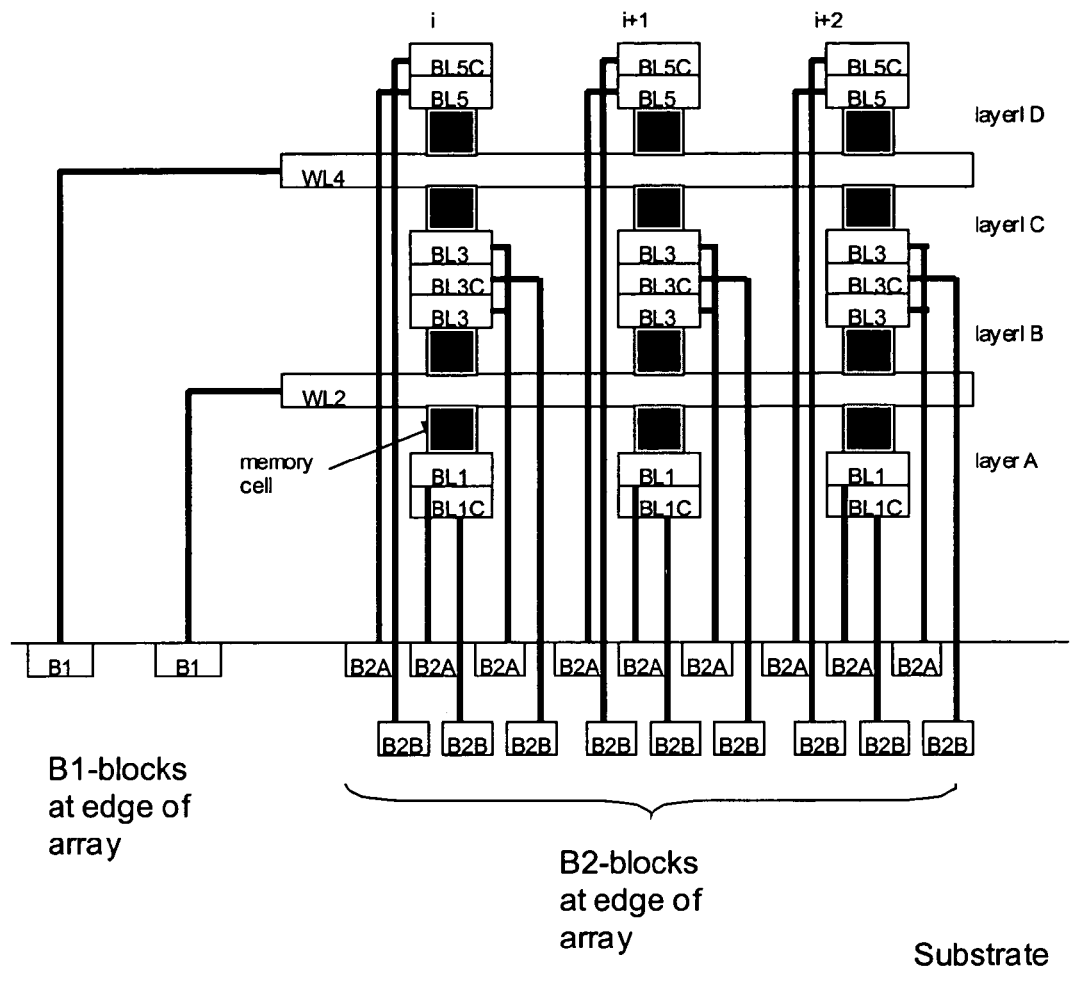
FIG. 10 is an end view of a 5 conductive layer, 4 memory cell level array integrated circuit memory according to the present invention.

FIG. 10 is an end view of a 5 conductive layer, 4 memory cell level array integrated circuit memory according to the present invention. The sense and control circuitry needed for $N^2$ memory cells is N blocks of word sense circuits 52 and N blocks each of bit sense circuits 54A and 54B for a total of 3N blocks. The blocks can typically be implemented as PMOS and NMOS transistors in a manner similar to the one-dimensional case. In the example of FIG. 10, layers 2 and 4 are word line 22 layers and layers 1, 3, and 5 are bit line 24 layers. These layers form four levels of memory, labeled layer A through and including layer D. In this example, the bit lines 24 are further divided into two regions, control region 74 and controlled resistance regions 76 and 78 as explained above. In the following explanations these regions are conceptually merged into one for ease of description.

Level A is accessed with the word lines 22 on level 2 and the bit lines 24 on level 1. Level B is accessed with the word lines 22 on level 2 and bit lines 24 on level 3. Level C is accessed with the word lines 22 on level 4 and the bit lines 24 on level 3. Level D is accessed with the word lines 22 on level 4 and the bit lines 24 on level 5. To simplify bit sensing, there are various ways to utilize the same word sense circuits 52 or bit sense circuits 54 connected to two layers at the same time. For example, instead of having separate bit sense circuits 54 for all three bit lines 24 layers (i.e., total of 3N B2 blocks), corresponding lines of bit lines 24 on levels 1 and 5 can use the same bit sense circuit 54 because memory layers A and D use different bit lines 24. Moreover, where layers are completely separate, bit sensing may be accomplished simultaneously with other layers.

Figure 11:
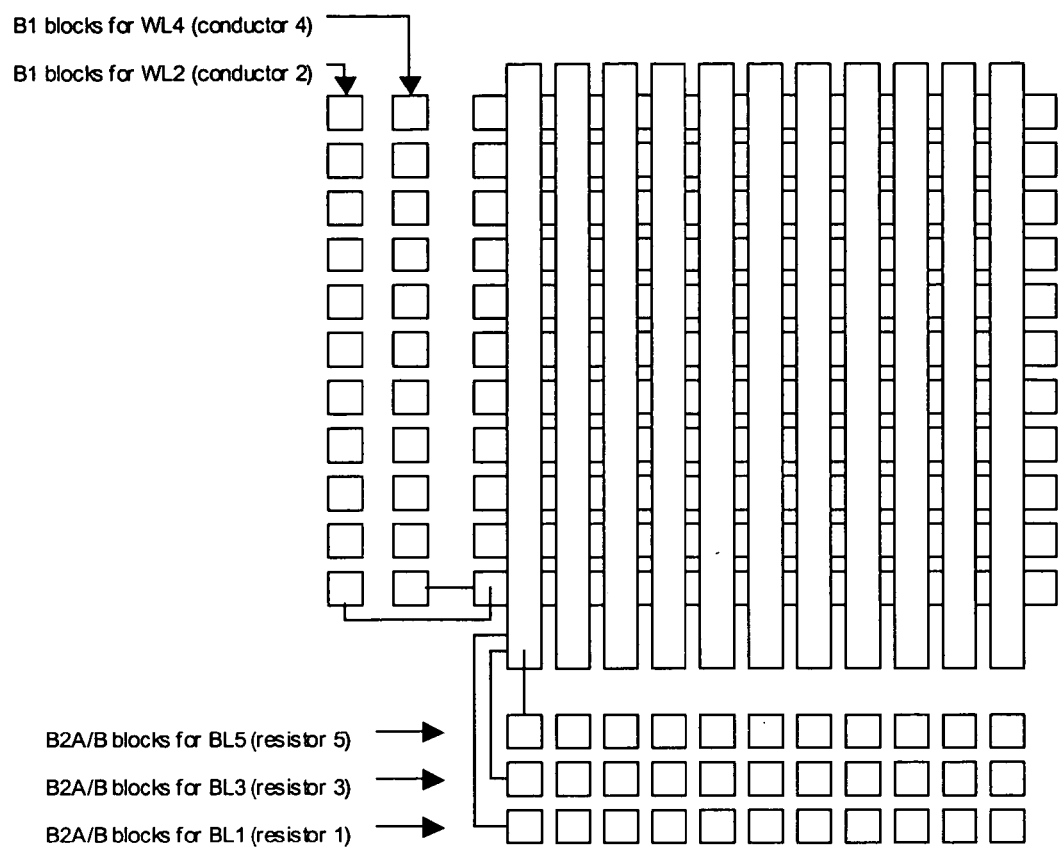
FIG. 11 is a plan view of the integrated circuit of FIG. 10.

FIG. 11 is a plan view of the integrated circuit of FIG. 10. In FIG. 11, a simplified schematic diagram of a plan view of structure of FIG. 10 is shown, where the row sense circuits 52 are used for the word lines 22 on levels 2 and 4, and the column sense circuits 54 are used for the bit lines 24 on levels 1, 3, and 5.

Figure 12:
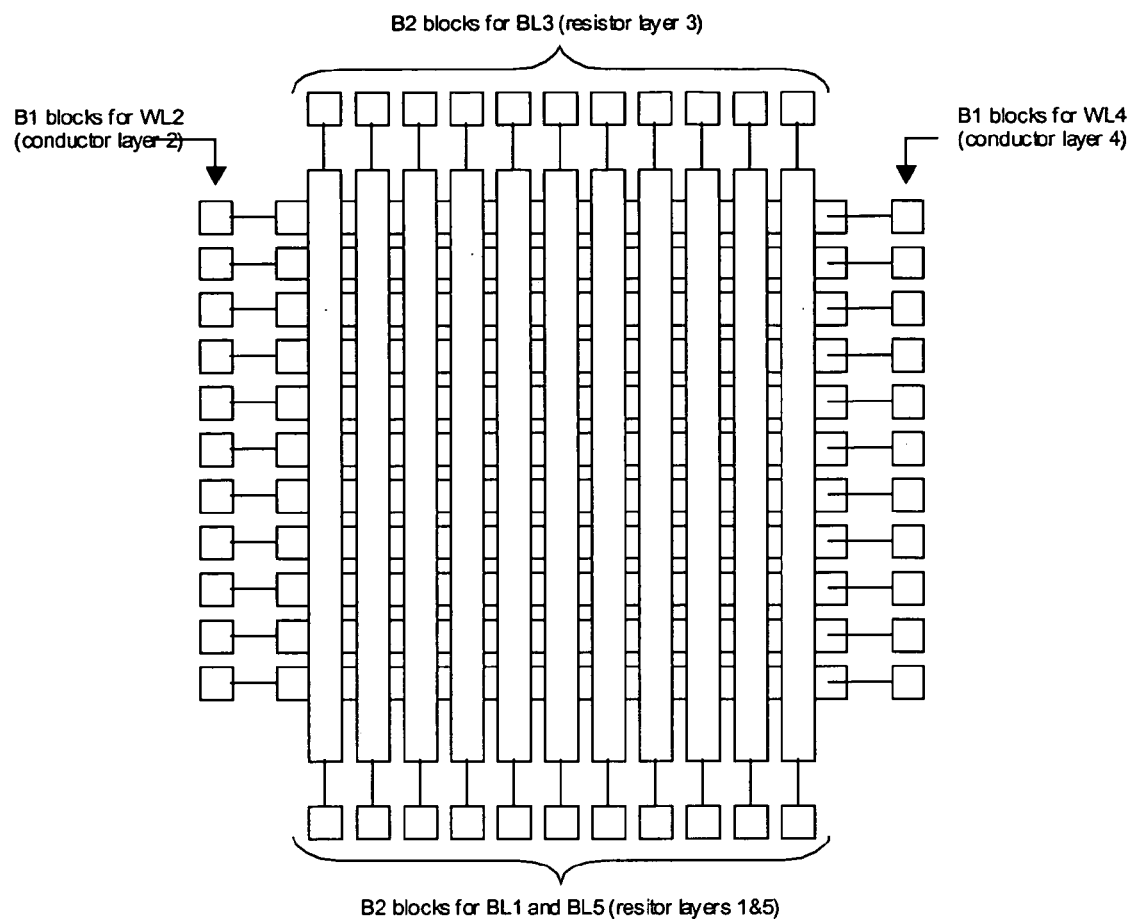
FIG. 12 is a plan view of an integrated circuit according to FIG. 8 with reduced number of B2 blocks and utilization of all four array edges for readout.

FIG. 12 is a plan view of an integrated circuit according to FIG. 8 with reduced number of B2 blocks, bit sense circuits 54, and utilization of all four array edges for readout. Other similar combinations exist, especially as the number of layers is increased, the advantage being that if the number of row sense circuits 52 and column sense circuits 54 can be reduced to 4N, each side of the rectangular array can conveniently house N of these sense circuits. This modification illustrates the concept for the 5-layer case.

What is claimed is:

1. A high density memory for use on an integrated circuit, comprising:
   a. a word line conductor;
   b. a via, coupled to the word line conductor, the via capable of being configured in a low resistance state and a high resistance state; and
   c. a bit line conductor, coupled to the via, the bit line conductor having high conductance in a first state and low conductance in a second state, wherein the via further comprises a conductive region and a nonconductive region, and the memory is programmed by applying a programming voltage to the nonconductive region to change the via from the high resistance state to the low resistance state.

2. The high density memory according to claim 1, wherein the memory is user-programmable by changing the state of the via.

3. A high density memory for use on an integrated circuit, comprising:
   a. a word line conductor;
   b. a via, coupled to the word line conductor, the via capable of being configured in a low resistance state and a high resistance state; and
   c. a bit line conductor, coupled to the via, the bit line conductor having high conductance in a first state and low conductance in a second state, wherein the via further comprises a fusable region, and the memory is programmed by selectively applying a programming voltage to the fusable region to change the via from the low resistance state to the high resistance state.

4. The high density memory according to claim 3, wherein the memory is user-programmable by changing the state of the via.

5. A high density memory for use on an integrated circuit, comprising:
   a. a word line conductor;
   b. a via, coupled to the word line conductor, the via capable of being configured in a low resistance state and a high resistance state; and c. a bit line conductor, coupled to the via, the bit line conductor having high conductance in a first state and low conductance in a second state, wherein the bit line conductor further comprises a control layer and a controllable conductance layer, and the controllable conductance layer is coupled to the via and disposed on the control region.

6. The high density memory according to claim 5, wherein the memory is user-programmable by changing the state of the via.

7. A high density memory for use on an integrated circuit, comprising:
   a. a word line conductor;
   b. a via, coupled to the word line conductor, the via capable of being configured in a low resistance state and a high resistance state; and
   c. a bit line conductor, coupled to the via, the bit line conductor having high conductance in a first state and low conductance in a second state, wherein the controllable conductance region layer further comprises a lightly-doped polysilicon region and a highly doped polysilicon region, and the highly-doped polysilicon region is coupled to the via.

8. The high density memory according to claim 7, wherein the memory is user-programmable by changing the state of the via.

9. A high density memory for use on an integrated circuit, comprising:
   a. a plurality of word line conductors;
   b. a plurality of bit line conductors, oriented generally orthogonal to the word line conductors and separated from the word line conductors by an insulating layer, the bit line conductors having a controllable conductance; and
   c. an array of vias, disposed at the intersections of the word line conductors and the bit line conductors, the vias selectively coupling the word line conductors to the bit line conductors.

10. The high density memory of claim 9, wherein the vias are selectively coupled during the manufacturing of the memory.

11. The high density memory of claim 9, wherein the vias are user-programmable.

12. The high density memory of claim 11, wherein each via further comprises a conductive region and a nonconductive region, and the memory is programmed by applying a programming voltage to the nonconductive region to change the via from the high resistance state to the low resistance state.

13. The high density memory according to claim 11, wherein each via further comprises a fusable region, and the memory is programmed by selectively applying a programming voltage to the fusable region to change the via from the low resistance state to the high resistance state.

14. The high density memory of claim 9, wherein the bit line conductors have high conductance in a first state and low conductance in a second state.

15. The high density memory according to claim 9, wherein the bit line conductor further comprises a control layer and a controllable conductance layer, and the controllable conductance layer is coupled to the via and disposed on the control layer.

16. The high density memory according to claim 15, wherein the controllable conductance layer further comprises a plurality of lightly-doped polysilicon regions and a plurality of highly-doped regions polysilicon regions, and wherein each via is coupled to a highly-doped polysilicon region.

17. The high density memory according to claim 9, wherein the plurality of word line conductors comprises a plurality of layers of word line conductors, wherein the plurality of bit line conductors comprises a plurality of layers of bit line conductors, and wherein the array of vias comprises a plurality of layers of arrays of vias.

18. A high density memory for use on an integrated circuit, comprising:
   a. a plurality of word sense circuits;
   b. a plurality of layers of word line conductors coupled to the word sense circuits;
   c. a plurality of bit sense circuits;
   d. a plurality of layers of bit line conductors coupled to the bit sense circuits, the layers of bit line conductors separated from the word line conductors by a plurality of insulating layers, each bit line conductors having a high conductance state when a corresponding bit sense circuit is active and a low conductance state when the bit sense circuit is inactive; and
   e. a plurality of layers of arrays of vias, disposed at the intersections of the word line conductors and the bit line conductors, the vias selectively coupling the word line conductors to the bit line conductors.

19. The high density memory of claim 18, wherein each bit line conductor further comprises a control layer and a controllable conductance layer, and the controllable conductance layer is coupled to the via and disposed on the control layer.

20. The high density memory of claim 19, wherein the controllable conductance layer further comprises a plurality of lightly-doped polysilicon regions and a plurality of highly-doped regions polysilicon regions, and wherein each via is coupled to a highly-doped polysilicon region.

* * * * *